United States Patent [19]

Kapusniak et al.

[11] Patent Number: 5,633,116

[45] Date of Patent: May 27, 1997

[54] METHOD FOR PREPARING PREPRESS COLOR PROOF AND INTERMEDIATE RECEIVER ELEMENT AND CARRIER PLATE USEFUL THEREIN

[75] Inventors: Richard J. Kapusniak, Webster; Colin C. Campbell, Rochester, both of N.Y.; Lawrence P. Pate, Buckinghamshire, United Kingdom; David A. Niemeyer, Rochester, N.Y.

[73] Assignee: Eastman Kokak Company, Rochester, N.Y.

[21] Appl. No.: 598,448

[22] Filed: Feb. 8, 1996

[51] Int. Cl.$^6$ ............................................. G03F 7/34
[52] U.S. Cl. ...................................... 430/254; 430/200
[58] Field of Search ................................ 430/200, 254

[56] References Cited

U.S. PATENT DOCUMENTS

| | | | |
|---|---|---|---|
| 3,060,023 | 10/1962 | Burg et al. | 430/254 |
| 3,622,320 | 11/1971 | Allen | 430/254 |
| 3,798,034 | 3/1974 | Laridon | 430/254 |
| 4,334,006 | 6/1982 | Kitajima et al. | 430/254 |
| 4,657,831 | 4/1987 | Ambro et al. | 430/14 |
| 4,659,927 | 4/1987 | Tago et al. | 250/318 |
| 4,766,053 | 8/1988 | Shinozaki et al. | 430/258 |
| 4,891,296 | 1/1990 | Tsurukiri et al. | 430/142 |
| 4,895,787 | 1/1990 | Platzer | 430/253 |
| 4,980,261 | 12/1990 | Yamada | 430/254 |
| 5,053,312 | 10/1991 | Takeda | 430/254 |
| 5,055,329 | 10/1991 | Namiki et al. | 428/42 |
| 5,075,722 | 12/1991 | Adolphson et al. | 355/77 |
| 5,108,868 | 4/1992 | Platzer | 430/143 |
| 5,240,810 | 8/1993 | Barjesteh | 430/293 |
| 5,300,398 | 4/1994 | Kaszczuk | 430/200 |
| 5,374,497 | 12/1994 | Kapusniak et al. | 430/254 |
| 5,501,937 | 3/1996 | Matsumoto et al. | 430/200 |

*Primary Examiner*—Richard L. Schilling
*Attorney, Agent, or Firm*—J. Lanny Tucker

[57] ABSTRACT

A prepress color proof can be prepared using suitable donor elements and an intermediate receiver element that has a roughened outer image receiving layer so that the color image is transferred with high image resolution. The intermediate receiver element can also have a cushioning layer beneath the outer image receiving layer that reduces the tendency for entrapped dirt particles to form minus density spot defects. In addition, a unique carrier plate can be used to carry the donor and intermediate receiver elements through laminating equipment. This carrier plate has a thermoplastic adhesive layer with sufficient tackiness to prevent irreversible dimensional change during lamination.

21 Claims, No Drawings

METHOD FOR PREPARING PREPRESS COLOR PROOF AND INTERMEDIATE RECEIVER ELEMENT AND CARRIER PLATE USEFUL THEREIN

FIELD OF THE INVENTION

In general, this invention relates to the color proofing art, and in particular to a method of preparing a dry prepress color proof, and to elements and carrier plates useful therein. More specifically, this invention relates to an intermediate receiver element and a carrier plate useful in a method for preparing a prepress color proof.

BACKGROUND OF THE INVENTION

Prepress color proofing systems are in widespread use in the printing industry. In a typical process, a multicolor original is separated into individual transparencies, called color separations, for the three subtractive primaries and for black. The separation process can be carried out in a number of well-known ways. For example, a graphic arts scanner can be used to create the color separations. In some instances, more than four color separations are employed. A color proof, called an "off-press" proof or a "prepress" proof, is then prepared from the color separations. The color proof is used by the printer to check color balance and other important quality control parameters.

Generally speaking, prepress color proofs are one of three types: namely (1) a color overlay that employs an image on a separate base for each color, (2) a single integral sheet process in which the separate color images are combined on a single base, or (3) a digital method in which the images are produced directly on a single base from digital data. The overlay and single sheet process are described in some detail in, for example, U.S. Pat. No. 4,895,787 (Platzer) which points out that the single sheet process is greatly preferred because the superposed supports of the overlay process drastically alter the appearance of the color proof.

U.S. Pat. No. 3,622,320 (Allen) describes a color proofing process of the single sheet type that is simple and convenient to use, and is a dry process that does not require the use of processing solutions. As described therein, the color-proofing process utilizes two or more light-sensitive donor elements, each of which contains a different dispersed colorant. The donor elements employ a light-sensitive resin that has a tackifying point that is raised by light exposure. That is, the resin is photohardenable. The imagewise-exposed donor element is pressed into contact with a receiver element while being heated to a temperature that is greater than the tackifying point in unexposed areas of the resin but less than the tackifying point in the exposed areas of the resin. Thus, the colored resin transfers from the unexposed areas to the receiver element. Second and subsequent donor elements, each containing a different colorant, are similarly exposed, and the image is transferred therefrom, in exact registration, to the same receiver element. For full color reproduction, it is customary to expose and transfer images from donor elements containing, respectively, black, magenta, cyan and yellow colorants. Commonly, the donor elements are exposed by use of a set of half-tone color separation positives.

Instead of using a photohardenable resin, acceptable results in a single sheet process can also be achieved by using a donor resin that is phototackifiable. With this type of resin, the exposed areas will be more tacky at the transfer temperature than the unexposed areas and, accordingly, the colored resin will transfer from the exposed areas to the receiver element. In this instance, the donor elements can be exposed by use of a set of half-tone color separation negatives. Phototackifiable compositions and their use in a single sheet process are described, for example, in U.S. Pat. No. 5,108,868 (Platzer).

Whatever donor resin is used, the process of making a color proof requires heat to increase the difference in surface adhesion between exposed and unexposed areas of the donor element and pressure to bring about effective image transfer. For example, as described in U.S. Pat. No. 5,374,497 (Kapusniak et al), the exposed donor element is placed in contact with the receiver element, the laminate that is so formed is passed between a pair of heated pressure rollers, and the donor element is then separated from the receiver element which then carries the transferred image. Separation of the donor element from the receiver element is usually accomplished by a manual peeling step, but can, if desired, be accomplished automatically by the laminator.

The noted laminate can be carried through the rollers using a dimensionally stable carrier plate that may be merely a metal sheet, or that employs a dimensionally stable receiver.

After the first image is transferred, it is critical that there be exact registration of each of the subsequently transferred images. One common way of accurately registering the successively transferred images is by means of a pin registration system.

A more advantageous means for registration is described in U.S. Pat. No. 5,374,497 (noted above). This patent describes dry color proofing processes wherein a colored image is transferred by the steps of hot lamination and peeling of successive donor elements and a single "intermediate" receiver element. The multicolor image can then be subsequently transferred from the intermediate receiver element to a final receiver element. Building the color image on the intermediate receiver element is advantageous because it permits the formation of an image that is not laterally reversed.

The noted patent describes the intermediate receiver element as being composed of any of a wide variety of pollEneric films such as polyesters, polyvinyl acetates, polyacrylates, polymethacrylates and polystyrenes. Optionally, the film base can be coated with a thin layer, such as a vinyl acetate, that transfers along with the multicolor image.

In a hot peel system, the donor element polymers that are transferred to the intermediate receiver element are somewhat fluid because the hot peeling step takes place at temperatures above the glass transition temperature of the donor element polymer. As a result, the donor element polymers tend to flow, in a non-imagewise manner, in the direction of peel during the hot peeling step. The result of such flow is a loss in image resolution.

Resolution, for example, can be expressed as the largest "% dot" resolvable on the intermediate receiver element when exposed to a 50 lines/cm screen. A high quality color proofing system would be able to resolve a 98% dot with a 50 line/cm screen. A 98% dot resolution (with a 50 line/cm screen) means that the image transferred to the intermediate receiver element should have 50 "holes" (areas of no colorant) per centimeter, and the "holes" comprise 2% of the total image area.

An intermediate receiver element of the prior art, which has a smooth outer surface, will not have the required 50 "holes"/cm because the donor polymers will flow into the "holes" during the hot peeling step. As a result, the colorant will cover the entire image area and the dots will not be resolvable using the noted screen.

In addition to the problem of poor resolution caused by flow during the hot peeling step, a further problem exists that has hindered the successful commercialization of the known dry color proofing system described in U.S. Pat. No. 5,374, 497 (noted above).

During the lamination step, each donor element and the intermediate receiver element are brought into intimate contact to form a laminate. Any foreign materials, referred to herein as "dirt", that are trapped between a donor element and the intermediate receiver element can interfere with the required intimate contact. The "dirt" particle, if large enough, can cause what is known as a "minus density spot defect". In other words, the dirt particle may cause an absence of colorant in a particular region of the image, and the diameter of this region is proportional to the height of the dirt particle.

The intermediate receiver elements described in the Kapusniak et al patent (noted above) suffer from both of these problems, that is inadequate resolution of the image because of flow of the transferred donor polymer, and an unacceptable number of minus density spot defects caused by entrapped dirt particles.

Still another problem associated with known dry color proofing processes relates to the carrier plates used to transport the donor and intermediate receiver elements through the laminating rollers. In the lamination step, at least one of the elements being laminated must be heated sufficiently to deliver suitable heat to the interface of the two elements. If the lamination temperature is above the glass transition temperature of the intermediate receiver or donor element support, an irreversible dimensional change will occur due to the relaxation of residual stresses within either element's support. Simple carrier plates known in the art, such as those described in U.S. Pat. No. 5,374,497 (noted above), are not able to prevent this highly undesirable irreversible dimensional change.

Thus, there is a considerable need for a method that provides a dry prepress color proof using intermediate receiver elements and carrier plates that do not suffer from the problems noted above. Such a method should be adaptable to existing equipment, reliable and simple to use.

SUMMARY OF THE INVENTION

The problems noted above have been solved with a method for preparing a prepress color proof in which colored images are successively transferred from donor elements to an intermediate receiver element by a process of lamination so as to form a multicolor image on the intermediate receiver element, the method comprising the steps of:

A) providing an intermediate receiver element,

B) providing at least two multilayer donor elements, each of which comprises:

a support, and one or more layers on the support, at least one layer being a photosensitive imaging layer comprised of a photohardenable or phototackifiable composition whose tackifying temperature is selectively changeable by imagewise exposure of the donor element to activating radiation, each of the donor elements having dispersed throughout one or more of its layers, a colorant that undergoes imagewise transfer to the intermediate receiver element, C) imagewise exposing each of the donor elements to activating radiation, and D) transferring a color image in either exposed or unexposed areas of each of the donor elements, by:

laminating at selected lamination temperature and pressure, in succession and register, each of the donor elements to the intermediate receiver element in a laminating device, followed by peeling each of the laminated donor elements from the intermediate receiver element, wherein the intermediate receiver element comprises a support, and an image receiving layer overlaying the support, the image receiving layer having a roughened outer surface characterized by a sufficient degree of roughness to impede flow of the transferred color image during lamination of each of the donor elements to the intermediate receiver element, thereby providing improved image resolution in the transferred color image, and wherein each of the donor elements and the intermediate receiver element are carried through the laminating device with a carrier plate, the carrier plate comprising a relatively stiff substrate having on one surface thereof a thermoplastic adhesive coating, the adhesive coating having a glass transition temperature that is less than the lamination temperature but is sufficiently high to provide low surface tackiness at room temperature, and the adhesive coating also exhibiting sufficient surface tackiness at the lamination temperature to prevent irreversible dimensional change of the intermediate receiver element during the laminating step.

This invention also provides an intermediate receiver element for use in a dry color proofing process in which a color image is transferred from a donor element to the intermediate receiver element by laminating at selected lamination temperature and pressure, and peeling the laminated donor element from the intermediate receiver element, the intermediate receiver element comprising a support, and an image receiving layer overlaying the support, the image receiving layer having a roughened outer surface characterized by a sufficient degree of roughness to impede flow of the transferred color image during lamination of each of the donor elements to the intermediate receiver element, thereby providing improved image resolution in the transferred color image.

In instances where dirt particles entrapped within the laminate of donor element and intermediate receiver element are likely to cause minus density spot defects, preferably the intermediate receiver elements also have a "cushioning" layer beneath the image receiving layer that reduces the tendency of entrapped dirt particles to cause the noted defects.

Further, this invention provides an element that is useful as a carrier plate in a dry color proofing process in which a color image is transferred from a donor element to an intermediate receiver element by laminating the donor element to the intermediate receiver element at selected lamination temperature and pressure in a laminating device, followed by peeling the laminated donor element from the intermediate receiver element, the carrier plate comprising a relatively stiff substrate having on one surface thereof a thermoplastic adhesive coating, the adhesive coating having a glass transition temperature that is less than the lamination temperature but is sufficiently high to provide low surface tackiness at room temperature, and the adhesive coating also exhibiting sufficient surface tackiness at the lamination temperature to prevent irreversible dimensional change of the intermediate receiver element during the laminating step.

The present invention is a significant improvement over the process and materials described in U.S. Pat. No. 5,374,497 (noted above). It can be used with existing equipment, reliably provide high quality dry prepress color proofs, and is simple to use. In particular, it solves the problem of poor image resolution from flow of heated transferred donor element polymers. Resolution of at least 98% dot with a 50 line/cm screen is achievable.

These advantages are achieved by using a particular intermediate receiver element having a roughened image receiving layer that provides desired image resolution by impeding hot flow of transferred donor polymer.

Moreover, in instances where the intermediate receiver element, or a donor element, used in the process has a thermoplastic support, and the lamination temperature is above the glass transition temperature of that support, it is desired to use the carrier plate of this invention in order to make sure that the irreversible dimensional change in either element (and particularly in the intermediate receiver element) is very low, that is generally less than 0.01%. This carrier plate has a particular thermoplastic adhesive layer with specific and different hot and cold tackiness so irreversible dimensional change in either the intermediate receiver element or donor element is extremely small. In practice then, this carrier plate is highly desirable to use when either type of element comprises a support that is normally dimensionally stable, but upon lamination, it becomes dimensionally instable.

In the optimum practice of this invention, the surface roughness of the receiving layer and the cushioning ability of the cushioning layer are specifically adapted, if necessary, by trial and error (but routine) experimentation to the characteristics of the particular photopolymers used in the donor elements, to the particular thickness of the photopolymer layer, to the particular lamination temperature and pressure employed in the laminating step, and to the particular hot peel temperature selected. In addition, the degree of tackiness of the adhesive coating in the carrier plate is specifically adapted, if necessary, by trial and error (but routine) experimentation, to the characteristics of the intermediate receiver element support and the lamination temperature used in the process.

DETAILED DESCRIPTION OF THE INVENTION

Essential requirements of the intermediate receiver element are that it adequately discriminate between exposed and unexposed areas of the donor elements to permit effective imagewise transfer, and that it be capable of reliably releasing the multicolor image to the final receiver element, or color proofing stock. The intermediate receiver element must also have good dimensional stability under normal handling conditions. In addition, the adhesion of the one or more layers to the support and to each other must be greater than the cohesive strength of the thermoplastic adhesive areas of the donor elements during the lamination step. In other words, the image receiving layer and other layers in the element must not delaminate from the support or from each other during the hot peeling step.

The intermediate receiver element has a suitable dimensionally stable support including but not limited to, internally sized paper base (such as that used in MATCHPRINT Proofing Base available from 3M Corp.), and polymeric films such as cellulose esters (for example, cellulose diacetate or cellulose triacetate), polystyrenes, polyamides, homo- and copolymers of vinyl chloride, polyvinylacetals, polycarbonates, polyolefins (for example, polyethylene or polypropylene), polyvinyl acetals, and polyesters of dibasic aromatic carboxylic acids with divalent alcohols [for example, poly(ethylene terephthalate) or poly(ethylene naphthalate)]. Preferably, the support is a transparent polymeric film.

Disposed on the support is an image receiving layer prepared from a suitable water-insoluble binder material that can receive an image from a donor element using the process described above, and that will not deform during the laminating steps of such transfer. Useful polymeric binder materials include, but are not limited to, vinyl acetate polymers (both homo- and copolymers), acrylate and methacrylate polymers (both homo- and copolymers, including polymers of ethyl acrylate and ethyl methacrylate), polyacrylamides, and cellulosic materials (such as hydroxyethyl cellulose). Homo- and copolymers of ethyl methacrylate are preferred. Mixtures of binder materials can be used if desired. Preferably, the binder material is transparent. Generally, the image receiving layer has a dry thickness of from about 0.5 to about 8 µm.

In accordance with this invention, it has been unexpectedly discovered that the image resolution in the process of the type described in U.S. Pat. No. 5,374,497 (noted above), can be significantly improved if the surface of the image receiving layer of the intermediate receiving element has an effective level of roughness as described above. Insufficient roughness gives rise to the flow problem described above. Excessive roughness causes a break up of the image and resulting loss in image density.

The outer surface roughness can be measured using a stylus that measures the height and number of peaks in a fixed area of the outer surface (such as by using a conventional surface profilometer). The height of a peak is defined as the distance from its top to the deepest adjacent valley or depression in the surface. The height of the peaks of interest is preferably in the range of greater than 0.1 and up to and equal to 1 µm. The surface can have peaks that are smaller or greater, but only those within the noted range are considered when defining the surface roughness according to this invention.

Thus, the minimum number of peaks in the roughened layer (in the noted peak size range) is at least about 480/mm$^2$ with at least about 750 peaks/mm$^2$ being preferred, and at least 1000 peaks/mm$^2$ being most preferred.

Roughening in the image receiving layer can be achieved in any number of ways. For example, the coated layer can be roughened physically with a suitable instrument, or in any other physical manner that will not adversely affect the layer's ability to receive the image transferred from a donor element.

Most preferably, the roughening is provided by the presence of a chemically inert matting agent which is incorporated during layer manufacture. The matting agent is comprised of particles generally having an average diameter of from about 0.5 to about 10 µm, and preferably having an average diameter of from about 2 to about 5 µm. In addition, the matting agent is insoluble in water and common organic solvents used in the graphic arts industry. Moreover, it does not deform during the laminating step or fail to maintain surface roughness during image transfer.

The matting agent is generally present in an amount of at least about 0.04 g/m$^2$ and preferably in an amount of from about 0.05 to about 0.5 g/m$^2$ of image receiving layer area. Various inorganic and organic matting agents can be used, including but not limited to, amorphous silica particles, glass beads, polymeric particles [for example, particles composed of homo- or copolymers of styrene or styrene derivatives (such as divinylbenzene), fluorocarbon polymers, and crosslinked polyacrylates] and other materials that would be readily apparent to one skilled in the art. Preferably, the matting agent particles are transparent. Amorphous silica particles are most preferred.

Moreover, it is has also been unexpectedly discovered that the use of a cushioning layer as a component of the intermediate receiver element greatly reduces the tendency for entrapped dirt particles to form objectionably large minus density spot defects. The cushioning layer is characterized by thickness and stiffness properties such that it undergoes a sufficient degree of flow during the lamination step to allow the dirt particles to sink into the image receiving layer. This sinking action dramatically reduces the effective height of the dirt particles and that, in turn, dramatically reduces the diameter of any resulting spot defect.

The cushioning layer is between the element support and the roughened image receiving layer. Preferably, it is present at a coverage of at least about 9 g/m$^2$, and has a hardness defined by a Young's modulus of less than about 7 kg$_f$/cm$^2$ as measured at a frequency of 10 hertz and at a given lamination temperature. More preferably, the layer coverage is from about 12 to about 24 g/m$^2$, and has a hardness defined by a Young's modulus of less than about 1 kgE/cm$^2$ as measured at a frequency of 10 hertz and at a given lamination temperature.

The cushioning ability of the cushioning layer is sufficient to reduce the tendency for dirt particles having an average diameter of about 50 µm trapped between a donor element and the intermediate receiver element to form minus density spot defects having an average diameter of less than about 200 µm In addition, the cushioning ability reduces the tendency for entrapped dirt particles having an average diameter of about 90 µm to form minus density spot defects having an average diameter of less than about 700 µm.

Useful cushioning layer materials include, but are not limited to, homo- and copolymers of vinyl acetate, homo- and copolymers of acrylates or methacrylates, polyesters, polyolefins and polyvinyl acetals. A particularly useful material is poly(vinyl acetate-co-crotonic acid).

Thus, in a preferred embodiment of this invention an intermediate receiver element for use in a dry color proofing process in which a color image is transferred from a donor element to the intermediate receiver element by laminating at selected lamination temperature and pressure, and peeling the laminated donor element from the intermediate receiver element, the intermediate receiver element comprising a transparent polymeric film support, and having disposed on one side thereof:

a cushioning layer comprising a layer of a vinyl acetate polymer present at a coverage of from about 12 to about 24 g/m$^2$ and having a hardness defined by a Young's modulus of less than about 1 kgf/cm$^2$ when measured at a frequency of 10 hertz and at the lamination temperature, and an image receiving layer overlaying the cushioning layer, the image receiving layer having a dry thickness of from about 0.5 to about 8 µm, and having a roughened outer surface characterized by the presence of at least about 750 peaks/mm$^2$, each peak ranging from 0.1 up to and equal to 1 µm in height, the image receiving layer comprising amorphous silica particles having an average diameter of from about 2 to about 5 µm at a coverage of from about 0.05 to about 0.5 g/m$^2$, distributed in an ethyl methacrylate polymer binder material.

The intermediate receiver element of this invention can be used in combination with conventional donor elements to provide prepress color proofs using any suitable carrier plate, including conventional carrier plates common in the trade. Typically, such carrier plates have a relatively stiff substrate (defined below) which is preferably a metal sheet.

However, still another unexpected discovery in accordance with this invention relates to the use of a unique carrier plate having a controlled degree of surface tackiness. If the surface of the carrier plate is insufficiently tacky at lamination temperatures, it will not be able to hold the intermediate receiver element with sufficient tenacity needed to prevent irreversible dimensional changes of less than 0.01% in the intermediate receiver element (length or width) during the laminating step. If the surface of the carrier plate is excessively tacky at room temperature, it will prevent the easy removal of the intermediate receiver element from the carrier plate during the peeling step.

The carrier plate has a relatively stiff substrate that does not undergo irreversible dimensional change. Such substrates include, but are not limited to, metallic substrates (such as anodized aluminum and steel), polymeric sheets, formica-like laminates, and paper card stock. Metallic substrates are preferred.

On the substrate of the carrier plate is a thermoplastic adhesive coating that exhibits the desired tackiness for carrying the laminated intermediate receiver element and donor plate through the laminating equipment. The adhesive coating can be composed of one or more thermoplastic adhesive materials including, but not limited to, polyurethanes, polyacrylates (homo- or copolymers), polymethacrylates (homo- or copolymers) and polyvinyl acetals. These coatings can also contain various fillers or plasticizers as would be well known in the art. A preferred adhesive coating comprises polyisobutyl methacrylate. The adhesive coating can be disposed over the entire substrate surface, or only in selected or random portions or patterns. Preferably, it is disposed over the entire substrate area. The adhesive coating is generally present at a coverage of from about 0.5 to about 200 g/m$^2$, and preferably at a coverage of from about 10 to about 150 g/m$^2$.

An intermediate layer can be disposed between the substrate and the adhesive coating if desired. Such a layer can be a conventional subbing layer, acrylic latex paint layer or a cushioning layer as described above for the intermediate receiver element. The carrier plate can be an endless belt, or a rigid material (plate) of defined length and width.

While the carrier plate of this invention is preferably used in combination with the intermediate receiver element of this invention, it would be readily apparent to one skilled in the art that the carrier plate can be used in any graphic arts process wherein a carrier plate is needed to transport one or more other materials through a lamination and/or peel process. Thus, it is not required that the carrier plate be used only with the intermediate receiver element of this invention.

Thus, a preferred embodiment of this invention is an element that is useful as a carrier plate in a dry color proofing process, the carrier plate comprising an anodized aluminum substrate having on one surface thereof:

an intermediate layer, and a thermoplastic adhesive coating of poly(isobutyl methacrylate) disposed over the entire surface of the intermediate layer at a coverage of from about 0.5 to about 200 g/m$^2$.

Donor elements useful in the practice of this invention can utilize any of a wide variety of supports, colorants and imaging compositions. The essential requirement is that the imaging layer functions effectively to transfer the colored image to the intermediate receiver element.

The donor element comprises at least an imaging layer as described herein, but can also include additional layers as described in more detail hereinafter, including a print-out layer as described in U.S. Pat. No. 5,374,497 (noted above). Useful colorants can be either dyes or pigments and they are not restricted to a particular layer.

If desired, all of the donor elements used in the color proofing process, for example, yellow, magenta, cyan and black donor elements, can be simultaneously exposed in order to reduce the total time needed to complete the preparation of the off-press proof.

Any of a wide variety of dimensionally stable polymeric films can be utilized as the support for the donor elements. Typical of useful polymeric film supports are films of cellulose esters such as cellulose diacetate or cellulose triacetate, polystyrene, polyamide, homo- and copolymers of vinyl chloride, poly(vinylacetal), polycarbonate, homo- and copolymers of olefins, such as polyethylene and polypropylene, and polyesters of dibasic aromatic carboxylic acids with divalent alcohols, such as poly(ethylene terephthalate) and poly(ethylene naphthalate).

Polyester films, such as films of polyethylene terephthalate, have many advantageous properties, such as excellent strength and dimensional stability, which render them especially advantageous for use as supports in the present invention. Such films can be coated with both a polymeric sub, for example a vinylidene chloride/methyl acrylate/itaconic acid terpolymer, and a gel sub as described in U.S. Pat. No. 3,271,178 (Nadeau et al). Such use of subbing layers is well known in the art for the purpose of rendering the polyester film receptive to coatings of functional layers.

As described hereinabove, the imaging layer utilized in the donor elements can be a photohardenable layer containing one or more photopolymerizable monomers or photocrosslinkable polymers, both of which are well known in the art. For example, exemplary photopolymerizable monomers include acrylic monomers, particularly bis-, tris- or tetrakis-acrylates or methacrylates. Typically, the photopolymerizable monomer is incorporated in the layer together with a compatible polymeric binder. Examples of suitable binders for this purpose include homopolymers and copolymers of acrylates and methacrylates, polyvinyl acetals, polyamides and cellulose esters.

It is preferred to use photocrosslinkable polymers to form a photohardenable imaging layer. Particularly preferred are photocrosslinkable polymers, such as polyesters, containing the photosensitive

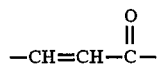

as an integral part of the polymer backbone. For example, preferred photocrosslinkable polymers are prepared from one or more compounds represented by the formulae (A)-(E) shown in U.S. Pat. No. 5,374,497 (noted above), incorporated hereinby reference, and references noted therein. These compositions are substantially non-tacky at room temperature but have a tackifying temperature, i.e., the temperature at which the composition becomes sensually tacky, of about 50° C. to about 200° C.

As described hereinabove, the imaging layer utilized in the donor elements can be a phototackifiable layer. Phototackifiable compositions are well known in the art and include those that are photodepolymerizable and those that are photoscissionable. Such compositions are described, for example, in "Imaging Processes and Materials", Neblette's Eighth Edition, published by Van Nostrand Reinhold, New York, N. Y., 1989. Phototackifiable compositions are also described, for example, in U.S. Pat. No. 5,108,868 (noted above).

Imaging layers utilized in the donor elements typically include a spectral sensitizer that serves to sensitize the composition to the desired portion of the spectrum. Suitable spectral sensitizers include anthrones, nitro sensitizers, triphenylmethanes, quirtones, cyanine dyes, naphthones, pyrylium and thiapyrylium salts, furanones, anthraquinones, 3-ketocoumarins, thiazoles, thiazolines, naphthothiazolines, quinalizones, and others described in U.S. Pat. No. 4,139,390 and references noted therein. Preferred sensitizers include the 3-ketocoumarins described in U.S. Pat. No. 4,147,552 and the thiazoline sensitizers of U.S. Pat. No. 4,062,686. Such sensitizers can be present in the imaging composition in effective sensitizing amounts easily determined by one of ordinary skill in the art.

Dyes or pigments can be utilized as the colorant in the donor elements. The colorant is typically incorporated in the imaging layer but all or part of the colorant can be incorporated in layers other than the imaging layer.

The colorant must be present in at least one layer that undergoes imagewise transfer in the lamination process. Typically, it is dispersed throughout the imaging layer, that is the photohardenable or phototackifiable layer. In some embodiments, more than one such layer can be included in the donor element and the colorant can be present in only one of these layers. As a further example, the colorant can be incorporated, in whole or in part, in a release layer that transfers imagewise along with the photohardenable or phototackifiable layer.

Colorants useful in the donor elements of this invention include pigments utilized in printing inks as well as dyes and pigments commonly employed in colored toner particles that are used in electrophotographic processes. Examples of particularly suitable colorants for use in this invention are given in U.S. Pat. No. 3,622,320 which refers to the use of MONOLITE Fast Black BS (Imperial Chemical Industries) in the black donor, MONOLITE Fast Yellow GTS (Imperial Chemical Industries) in the yellow donor, RUBINE Tone 4BS (Imperial Chemical Industries) or FASTEL Pink B Supra (Imperial Chemical Industries) in the magenta donor and HELIOGEN Blue LBG (Badische Anilin & Soda-Fabrik A.G.) or MONASTRAL Fast Blue GS (Imperial Chemical Industries) in the cyan donor.

Useful pigments available from HOECHST A.G. are described in U.S. Pat. No. 5,108,868 (noted above). These include Permanent Yellow G (C.I. 21095), Permanent Yellow GR (C.I. 21100), Permanent Yellow DHG (C.I. 21090), Permanent Rubine LGB (C.I. 15850), Permanent Pink F3B (C.I. 12433), Hostaperm Pink E (C. I. 73915), Hostaperm Red Violet ER (C.I. 46500), Permanent Carmine FBB (C.I. 12485), Hostaperm Blue B2G (C.I. 74160), Hostaperm Blue A2R (C.I. 74160) and Printex 25.

A preferred pigment for use in the magenta donor is Litho Rubine D 4566 DD that is manufactured by Badische Anilin & Soda-Fabrik A.G.

Still other useful colorants include Hansa Yellow G (C.I. 11680), Nigrosine Spirit Soluble (C.I. 50415), Chromogen Black ET00 (C.I. 14645), Rhodamine B (C.I. 45170), Fuchsine N (C.I. 42510) and C.I. Basic Blue 9 (C.I. 52015).

In the dry color proofing process in which the donor elements described above are utilized, the proof is constructed by successively laminating the color records on top of one another. To accomplish this successfully, the records must be exactly registered in each successive lamination step. Such exact registration can be accomplished by use of a print-out layer that greatly facilitates visual registration and avoids the need for the costly and complex pin registration systems of the prior art, as described in U.S. Pat. No. 5,374,497 (noted above).

Further examples of print-out systems useful in this invention include those described in Chapter 8 of Kosar, "Light-Sensitive Systems" published by John Wiley & Sons, Inc., New York, N.Y., 1965.

The donor elements can be designed to function by cohesive failure, that is, the fracturing of a layer at a point within its thickness, or to function by adhesive failure, that is, separation at an interface between layers. Donor elements which function by cohesive failure typically require that the delamination step occur while the donor element is hot. This is referred to as a "hot peel" process. Donor elements which function by adhesive failure permit carrying out of the delamination step after the donor element has cooled. This is referred to as a "cold peel" process.

In the process of U.S. Pat. No. 3,622,320 (noted above), the peel-apart step is carried out while the donor element is still hot from its passage through the heated rollers of the laminator. The colored imaging layer fractures as a result of cohesive failure, with such fracturing usually taking place near the mid-point of its thickness. Thus, only a portion of the total colorant is transferred to the receiver and a portion is left behind with the donor element to be discarded.

The cohesive failure described in U.S. Pat. No. 3,622,320 (noted above) is acceptable as long as the fracturing occurs at a point within the layer thickness such that a sufficient amount of the colored layer is transferred to give the required image density. It does not however make the most efficient use of the colorant since much of the colorant remains behind with the donor and is wasted. In a preferred embodiment that also relies on cohesive failure, the donor element comprises a support having on one side thereof, in order, a first photohardenable imaging layer that is free of colorant and a second photohardenable imaging layer that contains colorant. The thicknesses of the first and second photohardenable imaging layers should be so selected as to promote fracturing within the first photohardenable layer. Typically, the thickness of the first photohardenable imaging layer will be considerably greater than the thickness of the second photohardenable imaging layer.

Materials that are suitable for use in forming a release layer will depend on the materials used to prepare the imaging layer and the support. Typically, suitable release layers can be prepared from polymers such as polyesters, polyamides, cellulose esters, polyvinyl acetals and gelatin.

As explained in U.S. Pat. No. 5,374,497 (noted above), release layers can be used in a similar manner in donor elements that comprise a print-out layer.

Rather than relying on cohesive failure, a release layer can be utilized to provide for adhesive failure. Thus, with a donor element comprised of a support, a release layer and an imaging layer, the entire thickness of the imaging layer can be transferred rather than having fracture occur near the mid-point of the imaging layer. Rather than cohesive failure within the imaging layer, there can be adhesive failure at the interface of the release layer and the imaging layer or at the interface of the release layer and the support. An advantage of this design is that it makes better utilization of the colorant since none is left behind to be discarded with the donor element. The choice of which interface provides adhesive failure is determined by the choice of the components making up the respective layers. Thus, for example, a release layer can be designed so it either transfers imagewise together with the imaging layer or remains behind with the donor. In the former case, separation occurs between the release layer and the support since the imaging layer functions to pull the release layer off the support in an imagewise fashion. Colorant can be incorporated only in the imaging layer or only in the release layer or in both the imaging layer and the release layer, as desired. In the latter case, separation occurs between the release layer and the imaging layer and there would ordinarily be no reason to incorporate colorant in the release layer.

In such embodiments, the conventional donor elements can be used with conventional intermediate receiver elements in combination with the carrier plate of this invention.

Imagewise exposure of the donor elements to activating radiation can be carried out by use of a conventional vacuum printing frame. If desired, all of the donor elements required to form the final multicolor image can be exposed simultaneously, as hereinbefore described.

The laminating device used in the method of this invention can be any suitable device that provides the necessary heat and pressure to transfer the images from the imagewise exposed donor elements to the intermediate receiver element. Most typically, heated pressure rollers are used to carry out the lamination.

Laminating devices for use in laminating photosensitive elements employed in color proofing are well known in the art and are described, for example, in U.S. Pat. No. 4,659,927 (Tago et al) and U.S. Pat. No. 5,075,722 (Adolphson et al), all incorporated herein by reference. Another useful laminating device is described in copending and commonly assigned U.S.S.N. 08/347,927 (filed by Campbell et al on Dec. 1, 1994).

A suitable transport speed in the laminating device ranges from about 0.2 to about 1.5 cm/sec. Typical temperatures in the roller nip at the point where lamination occurs are generally in the range of from about 75° C. to about 115° C.

Lamination pressures suitable for use in the method of this invention can be readily determined in terms of "nip pressure" as measured in centimeters. As used herein, the term "nip pressure" refers to the width over which the heated rubber rollers of the laminating device are in intimate contact. This can be determined by inserting the donor element, while in superposed contact with a low density polyethylene film, between the heated rubber rollers, turning off the drive motor that turns the rollers, and locking the rollers together. A clearly visible stripe forms where the donor element and the low density polyethylene film were in intimate contact. The width of this stripe is measured as the "nip pressure." In the method of this invention, it is preferred that the "nip pressure" be in the range of from about 0.3 to about 0.9 cm.

The laminating device can be designed for automatic peeling or, to simplify construction and reduce costs, can rely on manual peeling that is performed by the operator. To facilitate manual peeling, a leader strip of suitable sheet material can be adhered to the donor element/intermediate receiver element sandwich. It is preferred to use the carrier plate of this invention to facilitate the lamination process.

The intermediate receiving element of this invention can be used repeatedly, if desired, so as to reduce the volume of waste that is generated. The intermediate receiver element can also serve as the carrier plate.

In making color proofs of half-tone dot pattern images it is often useful to simulate the dot gain that will occur when prints are made with lithographic printing plates. A suitable means for doing this with color proofs generated by electrophotographic techniques is described in U.S. Pat. No. 4,657,831 (Ambro et al).

Processes of the type in which donor elements are employed are commonly referred to as "peel development processes." For a detailed description of various "peel development processes" reference can be made to U.S. Pat. No. 4,334,006 (Kitajima et al) and references cited therein.

As explained above, in some instances the donor elements are utilized in a process which employs two lamination procedures, namely, (1) successive laminations from the donor elements to an intermediate receiver element of this invention to form the full color image followed by (2) lamination of the intermediate receiver element having the full color image to a final receiver element. In each instance, a choice of using a hot peel or a cold peel exists, as does a choice of a manual peel or an automatic peel. A useful combination, for example, is one employing an automatic hot peel for donor-intermediate receiver delamination and a manual cold peel for intermediate receiver element-final receiver element delamination. Many other combinations are, of course, also feasible.

The method of this invention is greatly superior to the color proofing processes of the prior art in that it is simple, inexpensive, requires no processing solutions or toners, provides for very accurate image registration by operators with only minimal skill requirements, permits simultaneous exposure of all color records, is well adapted to the preparation of scatter proofs and provides color proofs of remarkable quality.

Many other variations and embodiments that are not illustrated are within the scope of the present invention since only the essential requirements of the invention are described herein. In defining various numerical parameters, the term "about" is a clear, but flexible modifier meaning "approximately" because most parameters cannot be set with an exact limit. The degree of variation encompassed by the term will depend upon the specific parameter and the limits of its measurement.

The invention is further illustrated by the following examples of its practice. Unless otherwise indicated, percentages are by weight and amounts per area are dry coverage.

Example 1: Image Receiving Element

An image receiving element of the present invention was prepared by coating the following layers, in order, on a biaxially oriented poly(ethylene terephthalate) support:

1) a cushioning layer composed of poly(vinyl acetate-co-crotonic acid) (20.5 g/m$^2$, VINAC ASB-516 from Air Products Co.); and 2) a roughened image receiving layer composed of amorphous silica matting agent (0.22 g/m$^2$, SYLOID 244X-1669 from Grace-Davidson) dispersed in poly(ethyl acrylate) binder (1.08 g/m$^2$, ELVACITE 2042 polymer from ICI Americas). This matting agent provided at least 480 peaks/mm$^2$ which peaks had a height between 0.1 and 1.0 µm.

The cushioning layer was prepared by coating the noted polymer out of methyl ethyl ketone onto the polyester film support using conventional means, and drying. Its dry thickness was about 19 µm.

The image receiving layer was prepared by dispersing the matting agent (0.8%) with a dispersing aid, FC-171 fluoroaliphatic polymeric esters (0.025%, 3M Corp.) in isopropyl alcohol. The dispersion is then added to a solution of the noted polymer binder (4%) in a solvent mixture of isopropyl alcohol, methyl ethyl ketone and methyl isobutyl ketone (80:10:10 volume ratio), coated on the cushioning layer using conventional equipment, and dried. The dry thickness of this layer averaged 1.2 µm.

Example 2: Image Receiving Elements Having Various Image Receiving Layer Compositions Image receiving elements were prepared as described in Example 1 except that various materials and compositions were evaluated in the image receiving layer to find those that exhibited the desired resolution. Specifically, the elements of the invention had roughened outer surfaces that provided a resolution of at least 98% dot. It was determined from these experiments that this desired resolution was achieved with image receiving layers having a minimum of about 480 peaks/mm$^2$, the peaks having a height of from 0.1 and up to 1 µm. The number of peaks per area were determined using a conventional surface profilometer (Model 200 microtopographer, Gould Instruments). From this data, one skilled in the art would be able to choose suitable binder materials, matting agents (or other roughening means) at appropriate amounts and coverages to achieve the desired resolution without undue experimentation.

The various image receiving layer compositions, and the resulting resolution data are presented in Table I below. Both ELVACITE 2042 and 2043 are poly(ethyl methacrylate) binder materials available from ICI Americas. SYLOID 72, 244 and LV-6 are all amorphous silica particles available from Grace-Davidson Co. POLYFLO 190 is a modified micronized fluorocarbon polymer available from Micropowders, Inc. The "polymeric beads" were 4 µm average diameter particles prepared from divinylbenzene and ethylvinylbenzene (80:20 monomer weight ratio) using conventional techniques.

TABLE I

| Element | Binder Material | Binder Coverage (g/m$^2$) | Matting Agent | Matting Agent Coverage (g/m$^2$) | % Dot Resolution | *Peaks/mm$^2$ |
| --- | --- | --- | --- | --- | --- | --- |
| Control A | ELVACITE 2043 | 2.2 | SYLOID 72 | 0.054 | 80 | 82 |
| Control B | " | 2.2 | " | 0.108 | 90 | 251 |
| Control C | " | 2.2 | " | 0.216 | 90 | 474 |
| Control D | " | 2.2 | SYLOID 244 | 0.054 | 80 | 84 |

TABLE I-continued

| Element | Binder Material | Binder Coverage (g/m²) | Matting Agent | Matting Agent Coverage (g/m²) | % Dot Resolution | *Peaks/mm² |
|---|---|---|---|---|---|---|
| Control E | " | 1.1 | Polymer beads | 0.216 | 97 | 309 |
| Control F | " | 2.2 | POLYFLO 190 | 0.216 | 60 | 35 |
| Control G | " | 2.2 | " | 0.108 | 80 | 32 |
| Invention A | ELVACITE 2042 | 1.1 | SYLOID 244 | 0.216 | 98 | 3205 |
| Invention B | " | 1.1 | " | 0.324 | 98 | 4837 |
| Invention C | " | 1.1 | " | 0.486 | 98 | 5211 |
| Invention D | " | 1.1 | " | 0.162 | 98 | 1567 |
| Invention E | " | 0.55 | Polymer Beads | 0.432 | 98 | 747 |
| Invention F | " | 1.1 | " | 0.864 | 98 | 824 |
| Invention G | " | 0.55 | " | 0.216 | 98 | 491 |
| Invention H | " | 1.1 | " | 0.432 | 98 | 495 |
| Invention I | " | 1.1 | SYLOID LV-6 | 0.432 | 98 | 1476 |
| Invention J | " | 0.55 | " | 0.216 | 98 | 1528 |

*Measured peaks had height between 0.1 and 1.0 μm.

Example 3: Elements Having Various Cushioning Layers

Image receiving elements were prepared as described in Example 1 except that various materials and compositions were evaluated in the cushioning layer beneath the image receiving layer to find those that exhibited the desired properties.

In a first series of experiments, all of the layers were coated at 12.96 g/m². Table II shows the various polymers coated in the cushioning layer, the Young's modulus values measured at frequency of 10 hertz and a lamination temperature of 90 °C., and the resulting "minus image defect spot" sizes caused by simulated dirt particles of 50 and 90 μm in size. The Young's modulus values were measured using commercial equipment from Rheometrics (Solids Analyzer Model RSAII). As can be determined from the data, when the cushioning ability was decreased, the size of the defect increased.

The results of a second set of experiments are presented in Table III below. The coating coverage of the polymer in the cushioning layer was varied, and evaluated as to the effect on the defect spot size. As thicker layers were used, the cushioning ability increased. Acceptable cushioning occurs when the 50 μm "dirt" particles induce a negative image defect spot size of less than about 200 μm, and the 90 μm "dirt" particles induce a negative image defect spot size of less than about 700 μm.

In the experiments, ELVACITE 2044 is poly(n-butyl methacrylate), ELVACITE 2042 is poly(ethyl acrylate), ELVACITE 2016 is poly(methyl methacrylate-co-n-butyl methacrylate), and ELVACITE 2045 is poly(isobutyl methacrylate), all available from ICI Americas. VINAC B-15 is polyvinyl acetate, and VINAC ASB-516 is poly (vinyl acetate-co-crotonic acid), both available from Air Products Co.

TABLE II

| Element | Polymer | Young's Modulus (kgf/cm²) | 50 μ Defect Average Size (μm) | 90 μ Defect Average Size (μm) | Acceptable? |
|---|---|---|---|---|---|
| Invention K | ELVACITE 2044 | | 100 | 600 | Yes |
| Invention L | VINAC B-15 | 0.343 | 120 | 650 | Yes |
| Invention M | VINAC ASB-516 | 0.435 | 120 | 670 | Yes |
| Control H | ELVACITE 2042 | 48.8 | 310 | 780 | No |
| Control I | ELVACITE 2016 | 61.4 | 310 | 800 | No |
| Control J | ELVACITE 2045 | 138 | 310 | 830 | No |

TABLE III

| Element | Polymer | Polymer Coverage (g/m²) | 50 μ Defect Average Size (μm) | 90 μ Defect Average Size (μm) | Acceptable? |
|---|---|---|---|---|---|
| Control K | VINAC ASB-516 | 6.48 | 260 | 800 | No |
| nvention N | " | 9.72 | 120 | 700 | Yes |
| Invention O | " | 12.96 | 120 | 650 | Yes |
| Invention P | " | 20.52 | 120 | 450 | Yes |
| Control L | ELVACITE 2042 | 6.48 | 690 | 1000 | No |
| Control M | " | 12.96 | 310 | 780 | No |

Example 4: Carrier Plate of the Invention

A carrier plate of the present invention was prepared in the following manner:

Using conventional two-roller lamination, an anodized aluminum plate (0.38 mm thickness), spray coated over one surface thereof with a continuous coating of a conventional acrylic latex white paint (having a Tg less than the lamination temperature), was successively laminated with several layers of a 80:20 (w/w) blend of ELVACITE 2045 poly (isobutyl methacrylate) and benzyl isooctyl phthalate plasticizer to provide a final thermoplastic adhesive coating with a total coverage of 129 g/m².

Example 5: Method of Making a Color Prepress Proof

A preferred embodiment of the method this invention was carried out as follows:

An intermediate receiver element was prepared like that described in Example 1. This element comprised a biaxially oriented polyethylene terephthalate support (102 μm thickness). On the backside of the support was coated a dispersion of conventional polymeric matte particles (average size of 3.7–4 μm) in poly(methyl methacrylate) binder. On the other side was coated the cushioning and image receiving layers described in Example 1.

This element was placed on the carrier plate described in Example 4, backside down. A first, imagewise exposed conventional positive-working, photohardenable donor element having black pigment as described in U.S. Pat. No. 5,374,497 (noted above) was placed, emulsion-to-emulsion, in intimate contact with the intermediate receiver element on the carrier plate. The complete package of elements and carrier plate was passed through the nip of a conventional two-roller laminating device. The transport speed through the device was 0.423 cm/sec, and the lamination temperature in the roller nip was 90°–95 ° C.

As the laminated packaged exited the nip, the donor element was peeled (while hot) from the intermediate receiver element, leaving behind on the intermediate receiver layer, the pigmented top portion of the unexposed areas of the donor element (that is, a black image). This transferred portion of the donor element was then uniformly exposed to actinic radiation, the exposure being at least 33% of the original exposure of the donor element.

A second imagewise exposed donor element (containing cyan pigment) was similarly placed in contact with the intermediate receiver element carrying the first transferred image. This donor element comprised a print-out image useful for aligning the element on the intermediate receiver element as described in US-A-5,374,497 (noted above). Lamination, peeling and post-exposure were carried out again as described above.

Similarly, third and fourth imagewise exposed donor elements (containing magenta and yellow pigments, respectively) were aligned with the intermediate receiver layer on the carrier plate, laminated, and color images were transferred as described above. The result was a four-color image on the intermediate receiver layer.

When the intermediate receiver element and carrier plate were cooled to room temperature, the intermediate receiver element was peeled from the carrier plate. It was then placed emulsion-to-emulsion in contact with a conventional final receiver element (having a paper stock support with an adhesive layer) on a conventional non-adhesive final carrier plate which also comprised a hinged cover sheet of polyethylene terephthalate.

This package of materials was passed through the nip of a conventional two-roller laminator device at a transport speed of 0.423 cm/sec with a lamination temperature of 90°–95 ° C. in the roller nip. After removing the final receiver element-intermediate receiver element laminate from the carrier plate (and cover sheet), and cooling to room temperature, the support of the intermediate receiver element was peeled away to provide the desired prepress color proof.

The invention has been described in detail with particular reference to preferred embodiments thereof, but it will be understood that variations and modifications can be effected within the spirit and scope of the invention.

We claim:

1. A method for preparing a prepress color proof in which colored images are successively transferred from donor elements to an intermediate receiver element by a process of lamination so as to form a multicolor image on said intermediate receiver element, said method comprising the steps of:

A) providing an intermediate receiver element,

B) providing at least two multilayer donor elements, each of which comprises:

a support, and one or more layers on said support, at least one layer being a photosensitive imaging layer comprised of a photohardenable or phototackifiable composition whose tackifying temperature is selectively changeable by imagewise exposure of said donor element to activating radiation, each of said donor elements having dispersed throughout one or more of its layers, a colorant that undergoes imagewise transfer to said intermediate receiver element, C) imagewise exposing each of said donor elements to activating radiation, and D) transferring a color image in either exposed or unexposed areas of each of said donor elements, by:

laminating at selected lamination temperature and pressure, in succession and register, each of said donor elements to said intermediate receiver element in a laminating device, followed by peeling each of said laminated donor elements from said intermediate receiver element, wherein said intermediate receiver element comprises a support, and an image receiving layer overlaying said support, said image receiving layer having a roughened outer surface characterized by a sufficient degree of roughness to impede flow of said transferred color image during lamination of each of said donor elements to said intermediate receiver element, thereby providing improved image resolution in said transferred color image, and wherein each of said donor elements and said intermediate receiver element are carried through said laminating device with a carrier plate, said carrier plate comprising a metallic, polymeric sheet, formica laminate or paper card stock substrate having on one surface thereof a thermoplastic adhesive coating, said adhesive coating having a glass transition temperature that is less than said lamination temperature but is sufficiently high to provide low surface tackiness at room temperature, and said adhesive coating also exhibiting sufficient surface tackiness at said lamination temperature to prevent irreversible dimensional change of said intermediate receiver element during said laminating step.

2. The method of claim 1 wherein four donor elements are used, said donor elements containing, respectively, yellow, magenta, cyan and black colorants.

3. The method of claim 1 wherein at least one of said donor elements comprises first and second photosensitive imaging layers, said first photosensitive imaging layer being free of colorant and superposed on said donor element support, and said second photosensitive imaging layer containing said colorant and being superposed on said first photosensitive imaging layer.

4. The method of claim 1 wherein said intermediate receiver element further comprises a cushioning layer between said support and said receiving layer, said cushioning layer having sufficient cushioning ability during said laminating step to reduce the tendency for dirt particles trapped between each of said donor elements and said intermediate receiver element to form minus density spot defects.

5. The method of claim 1 wherein said lamination temperature is at least about 75° C.

6. The method of claim 1 wherein each of said donor elements, said intermediate receiver element and said carrier plate are transported through said laminating device with said the aid of one or more heated pressure rollers.

7. The method of claim 1 wherein the degree of roughness of said receiving layer outer surface is sufficient to achieve a 98% dot resolution when exposed to a 50 line/cm screen.

8. The method of claim 1 wherein:

four donor elements are used, said donor elements containing, respectively, yellow, magenta, cyan and black pigments in the outermost layer of each donor element, and each donor element comprising a polyester support and a photocrosslinkable polymer in said photosensitive imaging layer, said intermediate receiver element comprises a roughened receiving layer outer surface characterized by the presence of at least about 480 peaks/mm$^2$, each peak ranging from 0.1 up to and equal to 1 μm in height, said intermediate receiver element further comprises a cushioning layer between said support and said receiving layer, said cushioning layer being present at a coverage of at least about 9 g/m$^2$ and having a hardness defined by a Young's modulus of less than about 7 kg$_f$/cm$^2$ when measured at a frequency of 10 hertz and at said lamination temperature, whereby said cushioning layer provides sufficient cushioning ability during said laminating step to reduce the tendency for dirt particles having an average diameter of about 50 μm trapped between each of said donor elements and said intermediate receiver element to form minus density spot defects having an average diameter of less than about 200 μm, and to reduce the tendency for dirt particles having an average diameter of about 90 μm trapped between each of said donor elements and said intermediate receiver element to form minus density spot defects having an average diameter of less than about 700 μm, and said carrier plate comprised a metallic substrate and said adhesive coating exhibits sufficient surface tackiness at said lamination temperature to prevent irreversible dimensional change greater than about 0.01% in said intermediate receiver element during said laminating step.

9. The method of claim 4 wherein said cushioning layer is present at a coverage of at least about 9 g/m$^2$ and has a hardness defined by a Young's modulus of less than 7 kgf/cm$^2$ when measured at a frequency of 10 hertz and at said lamination temperature, whereby said cushioning layer provides sufficient cushioning ability during said laminating step to reduce the tendency for dirt particles having an average diameter of about 50 μm trapped between each of said donor elements and said intermediate receiver element to form minus density spot defects having an average diameter of less than about 200 μm, and to reduce the tendency for dirt particles having an average diameter of about 90 μm trapped between each of said donor elements and said intermediate receiver element to form minus density spot defects having an average diameter of less than 700μm.

10. The method of claim 9 wherein said cushioning layer is present at a coverage of at from about 12 to about 24 g/m$^2$ and has a hardness defined by a Young's modulus of less than 1 kgf/cm$^2$ when measured at a frequency of 10 hertz, and at said lamination temperature.

11. The method of claim 4 wherein said cushioning layer comprises a vinyl acetate polymer, an acrylate or methacrylate polymer, a polyester, a polyolefin or a polyvinyl acetal.

12. The method of claim 1 wherein said roughened outer surface of said intermediate receiver element is characterized by the presence of at least about 480 peaks/mm$^2$, each peak ranging from 0.1 up to and equal to 1 μm in height.

13. The method of claim 12 wherein said roughened outer surface of said intermediate receiver element is characterized by the presence of at least about 750 peaks/mm$^2$.

14. The method of claim 4 wherein the degree of roughness of said outer layer of said intermediate receiver element is provided by the presence of a matting agent having an average diameter of from about 2 to about 5 μm, said matting agent being present in an amount of at least about 0.04 g/m$^2$ of image receiving layer area.

15. The method of claim 14 wherein said matting agent is amorphous silica particles, glass beads, or polymeric particles which are distributed in a binder material.

16. The method of claim 15 wherein said binder material is a vinyl acetate polymer, acrylate or methacrylate polymer, polyacrylamide or cellulosic material, and said intermediate receiver element support is a transparent film.

17. The method of claim 1 wherein said carrier plate substrate is a metallic substrate.

18. The method of claim 17 wherein said metallic substrate is an anodized aluminum substrate.

19. The method of claim 1 wherein said thermoplastic adhesive coating in said carrier plate exhibits sufficient surface tackiness at said lamination temperature to prevent irreversible dimensional change greater than 0.01% in said intermediate receiver element during said laminating step.

20. The method of claim 1 wherein said carrier plate has an intermediate layer between said substrate and said thermoplastic adhesive coating.

21. The method of claim 1 wherein said thermoplastic adhesive coating comprises an acrylate or methacrylate polymer, a polyvinyl acetal, or a polyurethane.

* * * * *